United States Patent [19]
Koyama

[11] 3,940,678
[45] Feb. 24, 1976

[54] MULTI-INPUT SWITCHING MEANS

[75] Inventor: Hiroshi Koyama, Kamakura, Japan

[73] Assignee: Yamatake-Honeywell Company Ltd., Tokyo, Japan

[22] Filed: Dec. 31, 1974

[21] Appl. No.: 537,752

[52] U.S. Cl. .............................. 320/1; 340/173 CA
[51] Int. Cl.$^2$ H02M 3/06; H02J 15/00; G11C 11/24
[58] Field of Search ....... 340/173 R, 173 CA; 320/1

[56] References Cited
UNITED STATES PATENTS

| | | | |
|---|---|---|---|
| 3,084,321 | 4/1963 | Hinrichs et al. ......................... | 320/1 |
| 3,701,120 | 10/1972 | Charters et al. ............... | 340/173 CA |
| 3,714,623 | 1/1973 | Mickler ........................ | 340/173 CA |
| 3,731,286 | 5/1973 | Graalmann et al. ................. | 320/1 X |
| 3,836,893 | 9/1974 | Lamden ........................ | 340/173 CA |

*Primary Examiner*—Stuart N. Hecker
*Attorney, Agent, or Firm*—Arthur H. Swanson; Lockwood D. Burton

[57] ABSTRACT

A multiple input switching system includes an input isolation device, such as a transformer, in the input circuit. Switching devices are provided for sequentially connecting the several input circuits to a time-shared amplifier. The switching devices are actuated at a predetermined rate with a predetermined closed-time for each closure. Further switching devices are provided for transferring the data from each of the input circuits to a corresponding memory device. These further switching devices are operated synchronously with the first-mentioned switching devices but with a shorter close-time. The data values in the several memory devices may be selectively scanned asynchronously. Between each actuation of the input switching devices, additional switches are actuated which (1) short-circuits the input to the amplifier and (2) applies the output drift signal of the amplifier to a compensating storage capacitor. On subsequent actuation of the input and output switch devices, the compensating signal is superimposed on the data signal stored on the corresponding memory device.

7 Claims, 5 Drawing Figures

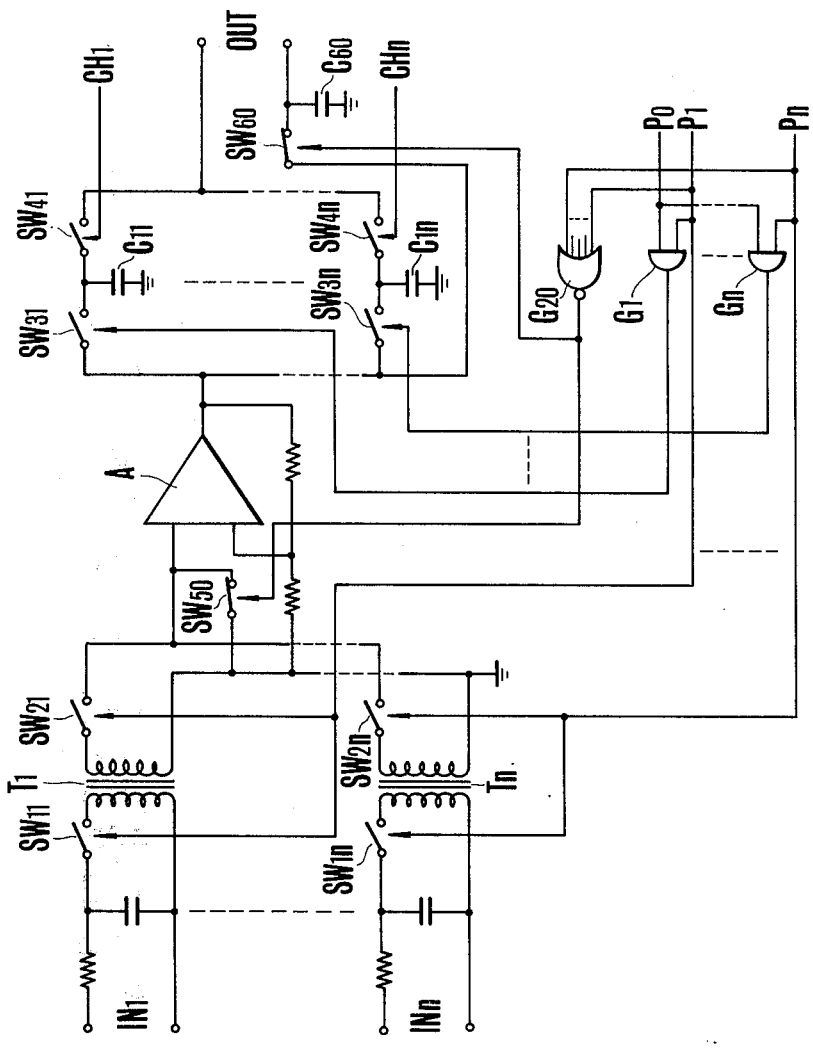
F I G. 5

MULTI-INPUT SWITCHING MEANS

BACKGROUND OF THE INVENTION

1. Field of the Invention

The present invention relates to an isolating multiple input switching, or multiplexing, system.

2. Description of the Prior Art

In prior art multiplex systems, where transformers are used for isolation for the individual input circuits, the switching of the individual transformer circuits must be sufficiently slow to allow the switching transients in the transformer to decay whereby to obtain a reasonably accurate output signal. Further, when the multiplexed signals were amplified in a common, or time-shared, amplifier, it was necessary, in order to maintain the high order of accuracy, to use a very high quality and very expensive amplifier to avoid problems of offset and temperature drift voltages.

SUMMARY OF THE INVENTION

It is an object of the present invention to provide an improved isolated multiplexing system which avoids the shortcomings of the prior art systems.

It is another object of the present invention to provide an improved multiplexing system as set forth wherein the scanning of the output signals may be accomplished at relatively high speed.

It is a further object of the present invention to provide an improved multiplexing system as set forth wherein compensation is provided for offset and drift signals of the amplifier.

In accomplishing these and other objects, there has been provided, in accordance with the present invention, a multiple input, or multiplexing, switching system wherein input isolation is accomplished as by input transformer means. The input signals are sequentially switched into the input of a time-shared amplifier at a predetermined switching rate. The output of the amplifier is commutated, as by a plurality of commutating switch means, to a plurality of memory devices. The commutating switch means are actuated synchronously with the input signal switching means but with a shorter close-time than the input switching means. This allows the switching transients to be dissipated before the data signal is applied to the several storage devices. The data stored in the memory devices may be scanned by actuation of a plurality of output or read-out switching means. The read-out switching means may be actuated asynchronously with respect to the input and commutating switching means. These switching means may be actuated at a relatively high speed as required by whatever utilization devices may be connected thereto.

The multiplexing and commutating switches are actuated by a series of spaced pulses. Further switching means is arranged to be actuated during the interval between the actuation of the multiplexing and commutating switches. The further switching means effectively short-circuits the input of the amplifier and at the same time connects the output terminal of the amplifier to a storage capacitor. The signal thus applied to the storage capacitor is representative of the offset and drift signal of the amplifier. Upon subsequent actuation of the commutating switching means, the signal stored on the capacitor is superimposed upon the data signal to provide compensation for the offset and drift of the amplifier.

BRIEF DESCRIPTION OF THE DRAWINGS

A better understanding of the present invention may be had from the following detailed description when read in connection with the accompanying drawings in which:

FIG. 5 is a schematic circuit diagram of yet another structure embodying the present invention.

DESCRIPTION OF THE EMBODIMENTS

Figure 1:
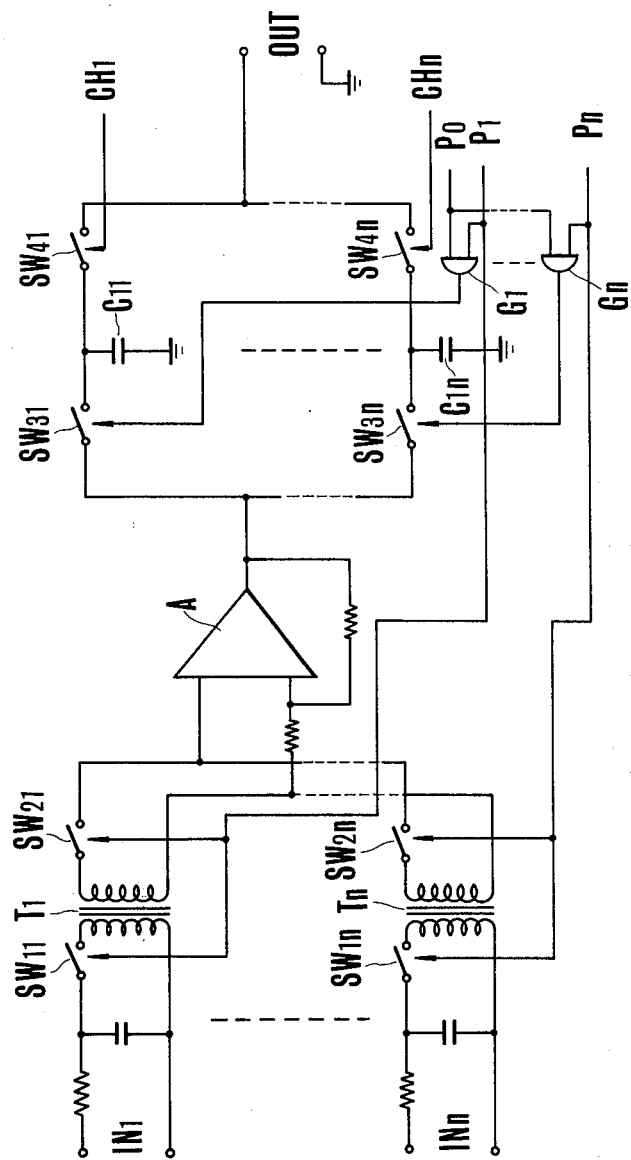
FIG. 1 is a schematic circuit diagram of a multiplexing system embodying the present invention.

Referring now to the drawings in more detail, there is shown in FIG. 1 a plurality of input circuits $IN_l$ through $IN_n$, each connected to the primary winding of an isolating transformer $T_l$ through $T_n$ through associated first multiplexing switch elements $SW_{1l}$ through $SW_{1n}$. The secondary windings of the transformers $T_l$ through $T_n$ are connected in parallel through second multiplexing switches $SW_{2l}$ through $SW_{2n}$ to the input of a time-shared operational amplifier A. While these switches just discussed have been illustrated as mechanical switches, it is anticipated that these will be solid state switch devices such as field effect transistors.

The output terminal of the amplifier A is connected to a plurality of commutating switches $SW_{3l}$ through $SW_{3n}$, corresponding in number to the number of input circuits. A plurality of memory devices, again corresponding in number to the number of input circuits, represented by the capacitors $C_{1l}$ through $C_{1n}$ are connected, respectively, to the output of the amplifier A through the aforementioned commutating switches. A plurality of read-out scanning switches $SW_{4l}$ through $SW_{4n}$ are connected, respectively, between the capacitors $C_{1l}$ through $C_{1n}$ to an output circuit.

Figure 2:
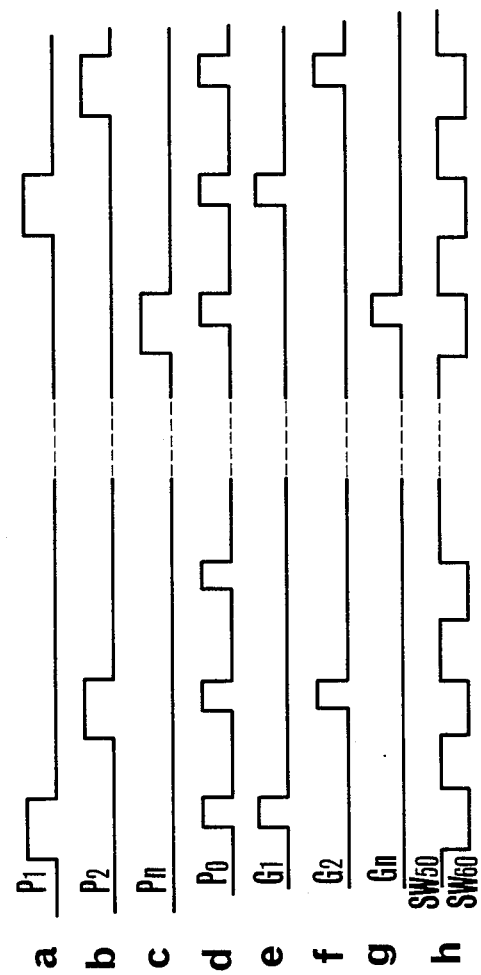
FIG. 2 is a wave-form chart useful in explaining the present invention.

Reference to FIG. 2 will assist in the understanding of the operation of the circuit just described. The multiplexing switches and the commutating switches are controlled from a series of control signals from respective sources designated $P_o$ through $P_n$. Referring to the chart of FIG. 2, it will be noted that the control pulses $P_1$, $P_2$ and $P_n$ are of a relatively long duration. These pulses are applied to control the actuation of the multiplexing switches $SW_{1l}$ through $SW_{1n}$ and $SW_{2l}$ through $SW_{2n}$, the pulses being appplied to control those switches directly. It will be noted that the pulses $P_1$, $P_2$ . . . $P_n$ occur in time-spaced sequence whereby the switches controlled thereby are actuated sequentially on a predetermined time base as noted on lines A, B and C of the chart of FIG. 2. The control pulses $P_o$, shown on line D of the FIG. 2 are applied as one input signal to each of a plurality of AND gates $G_l$ through $G_n$. These pulses are in the nature of clock pulses and occur synchronously with the sum of the pulses $P_l$ through $P_n$. It will be noted that the pulses $P_o$ are of shorter duration and timed to occur during the latter portion of the period of the pulses $P_l$ through $P_n$. A second input to the AND gates $G_l$ through $G_n$, respectively, are taken from the pulses $P_l$ through $P_n$. Thus, the gates $G_l$ through $G_n$ are sequentially enabled by the pulses $P_l$ through $P_n$ and are turned on by the pulses $P_o$. The output of the gates $G_l$ through $G_n$, as seen on lines E, F and G of FIG. 2, are applied to control the actuation, sequentially, of the commutating switches $SW_{3l}$ through $SW_{3n}$. The close time of the several switches is effectively coextensive with the pulse length of the corresponding actuating pulses. Thus, the close time of the commutating switches $SW_{3l}$ through $SW_{3n}$ is substantially shorter than the close time of the multiplexing switches at the input of the amplifier. With this arrangement, the switching transients incidental to the actuation of the switches in connection with the isolating transformers have been allowed to dissipate before the corresponding signals are transferred from the amplifier to the memory devices, or storage capacitors, $C_{1l}$ through $C_{1n}$. The output scanning switches $SW_{4l}$ through $SW_{4n}$ are actuated independently and asynchronously with respect to the multiplexing and commutating switches. The switches $SW_{4l}$ through $SW_{4n}$ are individually actuated, respectively, from signals applied over channel select lines $CH_l$ through $CH_n$. It may be noted that the actuation of the switches $SW_{4l}$ through $SW_{4n}$ may or may not be actuated in sequence and the rate of selection may be much faster or much slower than the predetermined actuation rate of the multiplexing and commutating switches.

Figure 3:
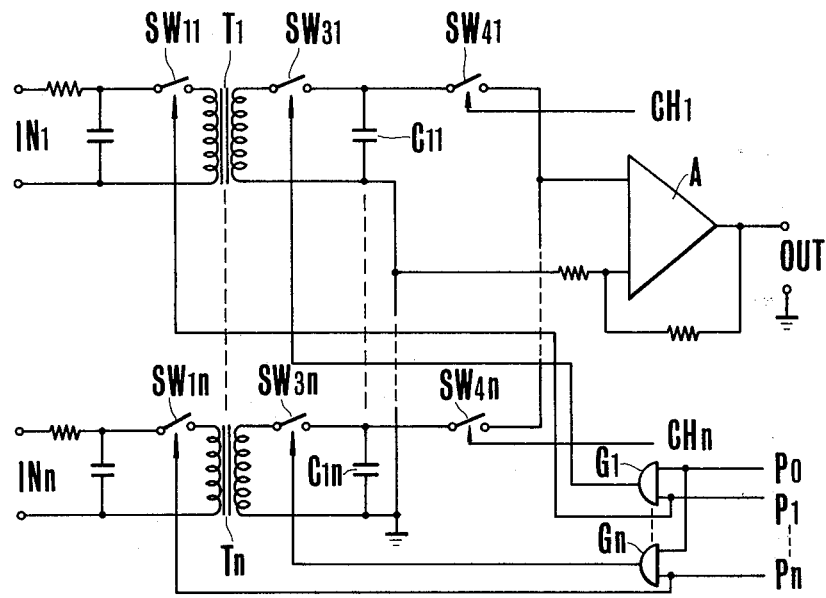
FIG. 3 is a schematic circuit diagram of a different embodiment of the present invention.

Whereas in FIG. 1, the commutating switches $SW_{3l}$ through $SW_{3n}$ and the scanning switches $SW_{4l}$ through $SW_{4n}$ are active with respect to a post-amplification or high level signal; in the structure shown in FIG. 3, the commutating switches and the scanning switches are operative on a pre-amplification or low level signal.

In the structure illustrated in FIG. 3, the input circuits $IN_l$ through $IN_n$ are also connected to the primary winding of associated isolating transformers $T_l$ through $T_n$ through input multiplexing switches $SW_{1l}$ through $SW_{1n}$, respectively. The secondary winding of the isolating transformers $T_l$ through $T_n$ are connected directly to the memory devices represented by the capacitors $C_{1l}$ through $C_{1n}$ by the commutating switches $SW_{3l}$ through $SW_{3n}$, respectively. As before, the multiplexing and commutating switches are actuated by pulses from the pulse sources $P_o$ through $P_n$. Here too, the actuation of the commutating switches $SW_{3l}$ through $SW_{3n}$ are operated synchronously with the multiplexing switches $SW_{1l}$ through $SW_{1n}$ but have a relatively shorter close time. In this structure, the data signal stored in the memory capacitors are the relatively low level signals derived directly from the transformer secondary windings. The plurality of scanning output switches $SW_{4l}$ through $SW_{4n}$ as before asynchronously scan the data stored on the storage capacitors $C_{1l}$ through $C_{1n}$. Here, however, the scanned signals are applied as input signals to the operational amplifier A, the output of the amplifier then becomes the output of the system.

Figure 4:
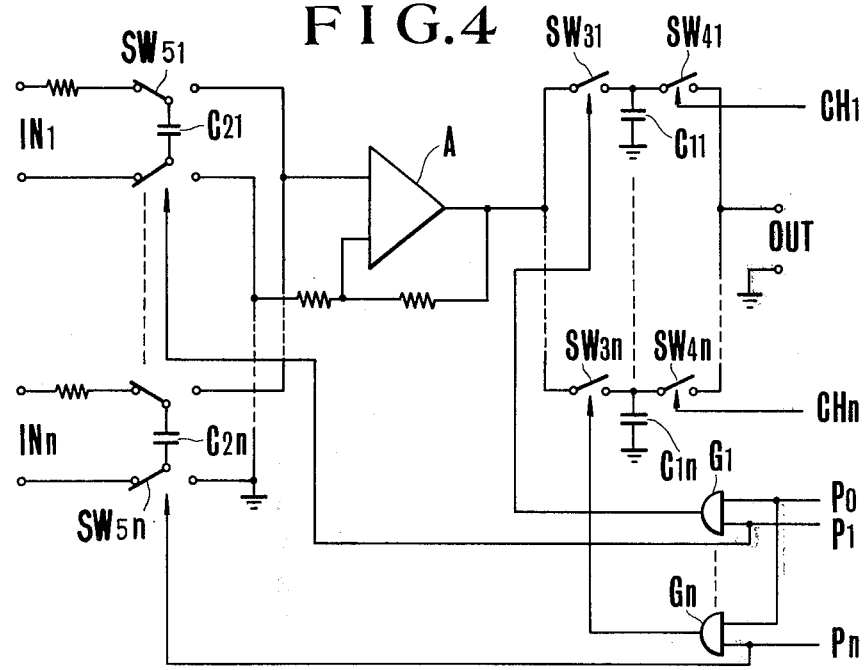
FIG. 4 is a schematic circuit diagram of another embodiment of the present invention.

In FIG. 4, there is shown a structure which is substantially identical to that shown in FIG. 1 with the exception that the isolating transformers are replaced with so-called flying capacitors. Thus, the input circuits $IN_l$ through $IN_n$ are connected, respectively, to a plurality of double pole, double throw switches $SW_{5l}$ through $SW_{5n}$. A plurality of input capacitors $C_{2l}$ through $C_{2n}$ are connected respectively across the common poles of the double pole, double throw switches. These switches serve both as multiplexing switches and as isolation means. As before, the switches are sequentially actuated by signals derived from the pulse sources $P_l$ through $P_n$. In the switch condition shown, the capacitors $C_{2l}$ through $C_{2n}$ are connected to their respective input circuits and are charged to a value representative of the several input signals. As the switches $SW_{5l}$ through $SW_{5n}$ are sequentially actuated, the charge on the capacitors $C_{2l}$ through $C_{2n}$ are sequentially transferred as input signals to the operational amplifier A. The output of the amplifier A is commutated, stored, and subsequently scanned as in the system described in connection with FIG. 1.

In FIG. 5 there is shown another circuit which is substantially identical to that shown and described in connection with FIG. 1 with the addition of means for compensating the output signal from the amplifier for offset and drift voltages. A switch $SW_{5o}$ is arranged to connect the input of the amplifier A to ground, periodically. Simultaneously therewith, a second switch $SW_{6o}$ is arranged to connect the output of the amplifier to an error memory device represented by the capacitor $C_{6o}$. The switches $SW_{5o}$ and $SW_{6o}$ are arranged to be closed during the interval between closure of the multiplexing switches. That is, the switches $SW_{5o}$ and $SW_{6o}$ are closed at a time when none of the multiplexing or commutating switches is closed. This is accomplished by connecting all of the pulse signals from sources $P_l$ through $P_n$ to the several inputs of a NOR gate $G_{2o}$. The output of that gate is illustrated in line H of FIG. 2. Thus, between actuation of the successive multiplex switches, the input to the amplifier A is connected to ground or zero potential. When the input to the amplifier A is thus grounded, any signal appearing at the output thereof will represent inherent offset or drift in the amplifier. The charge thus stored on the capacitor is then superimposed upon the next output signal resulting from the operation of the output scanning switches $SW_{4l}$ through $SW_{4n}$ since the capacitor 60 will be successively connected in series with the storage capacitors $C_{1l}$ through $C_{1n}$.

Thus, there has been provided, in accordance with the present invention, an improved isolated multiplexing system which includes means whereby the output signals can be scanned at a relatively high speed independently of the multiplexing rate, and in which the time shared amplifier includes means for compensating for offset and drift signals thereof.

The embodiments of the invention in which an exclusive property or privilege is claimed are defined as follows:

1. A multiplexing switching system comprising a plurality of signal input channels;
   a plurality of reactive isolating means;
   a plurality of multiplex switch members connected, respectively, between said input channels and said reactive isolating means;
   means for actuating said multiplex switch means sequentially at a predetermined rate with a predetermined close-time for each actuation of each of said switch members;
   a plurality of data storage devices;
   a plurality of commutating switch members connected, respectively, between said reactive isolating means and said data storage devices;
   means for actuating said commutating switch members synchronously with respect to said multiplex switch members but with a predetermined close-time which is less than the close-time of said multiplex switch members;
   an output circuit;
   a plurality of read-out scanning switch members connected, respectively, between said data storage devices and said output circuit; and means for actuating said read-out scanning switches asynchronously with respect to said multiplexing switch members.

2. The multiplexing switching system as set forth in claim 1 and further including a time-shared amplifier connected between said read-out scanning switch members and said output circuit.

3. The multiplexing switching system as set forth in claim 1 wherein said reactive isolating means comprise flying capacitors.

4. The multiplexing switching system as set forth in claim 1 wherein said reactive isolating means comprise transformers.

5. The multiplexing switching system as set forth in claim 4 and further including a time-shared amplifier connected between said reactive isolating means and said commutating switch members.

6. The multiplexing switching system as set forth in claim 5 wherein said multiplex switch members comprise a first plurality of switch elements connected, respectively, between said input channels and primary winding means on said transformers, and a second plurality of switch elements connected, respectively, between said secondary winding means on said transformers and said amplifier, said first and second plurality of switch elements being synchronously driven with respect to each other.

7. The multiplexing switching system as set forth in claim 6 and further including drift and offset compensating means for said amplifier, said compensating means comprising a first compensation switch member connected between the input of said amplifier and ground, a compensation signal storage capacitor, a second compensation switch member connected between the output of said amplifier and said capacitor, means for actuating said compensation switch members in the interval between successive actuations of said multiplex and commutating switch elements, and means for superimposing the compensation signal stored on said storage capacitor on output signals of said multiplexing switching system.

* * * * *